United States Patent
Takakuwa et al.

(10) Patent No.: US 6,842,230 B2
(45) Date of Patent: Jan. 11, 2005

(54) EXPOSING METHOD

(75) Inventors: Manabu Takakuwa, Yokkaichi (JP);
Keita Asanuma, Yokohama (JP);
Tatsuhiko Higashiki, Fujisawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 21 days.

(21) Appl. No.: 10/304,866

(22) Filed: Nov. 27, 2002

(65) Prior Publication Data

US 2003/0117599 A1 Jun. 26, 2003

(30) Foreign Application Priority Data

Nov. 28, 2001 (JP) ........................................ 2001-363133

(51) Int. Cl.[7] ........................ G03B 27/32; G03B 27/42; G03B 27/68
(52) U.S. Cl. .............................. 355/77; 355/52; 355/53
(58) Field of Search .............................. 355/52, 53, 77; 356/124

(56) References Cited

U.S. PATENT DOCUMENTS

| 5,402,224 A | 3/1995 | Hirukawa et al. | 356/124 |
| 5,468,580 A * | 11/1995 | Tanaka | 430/22 |
| 5,969,800 A | 10/1999 | Makinouchi | 355/53 |
| 6,011,611 A * | 1/2000 | Nomura et al. | 355/67 |
| 6,697,698 B2 * | 2/2004 | Yoshitake et al. | 700/124 |
| 2001/0017693 A1 * | 8/2001 | Zheng et al. | 355/77 |
| 2003/0095247 A1 * | 5/2003 | Nakao | 356/121 |

FOREIGN PATENT DOCUMENTS

| EP | 1 024 522 A1 | 8/2000 |
| JP | 6-5488 | 1/1994 |
| JP | 2001-118791 | 4/2001 |
| JP | 2001-338860 | 12/2001 |

OTHER PUBLICATIONS van den Brink, M. A. et al., Matching Management of Multiple Wafer Steppers Using A Stable Standard and A Matching Simulator, Integrated Circuit Metrology, Inspection, and Process Control III, (1989), SPIE vol. 1087, pps. 218–232.

* cited by examiner

*Primary Examiner*—Rodney Fuller
(74) *Attorney, Agent, or Firm*—Finnegan, Henderson, Farabow, Garrett & Dunner, L.L.P.

(57) ABSTRACT

Lens distortion correction is characterized by obtaining a correction parameter by using the difference between the latest QC data used when exposing a overlaying layer and the latest QC data used when exposing a overlaid layer.

14 Claims, 9 Drawing Sheets

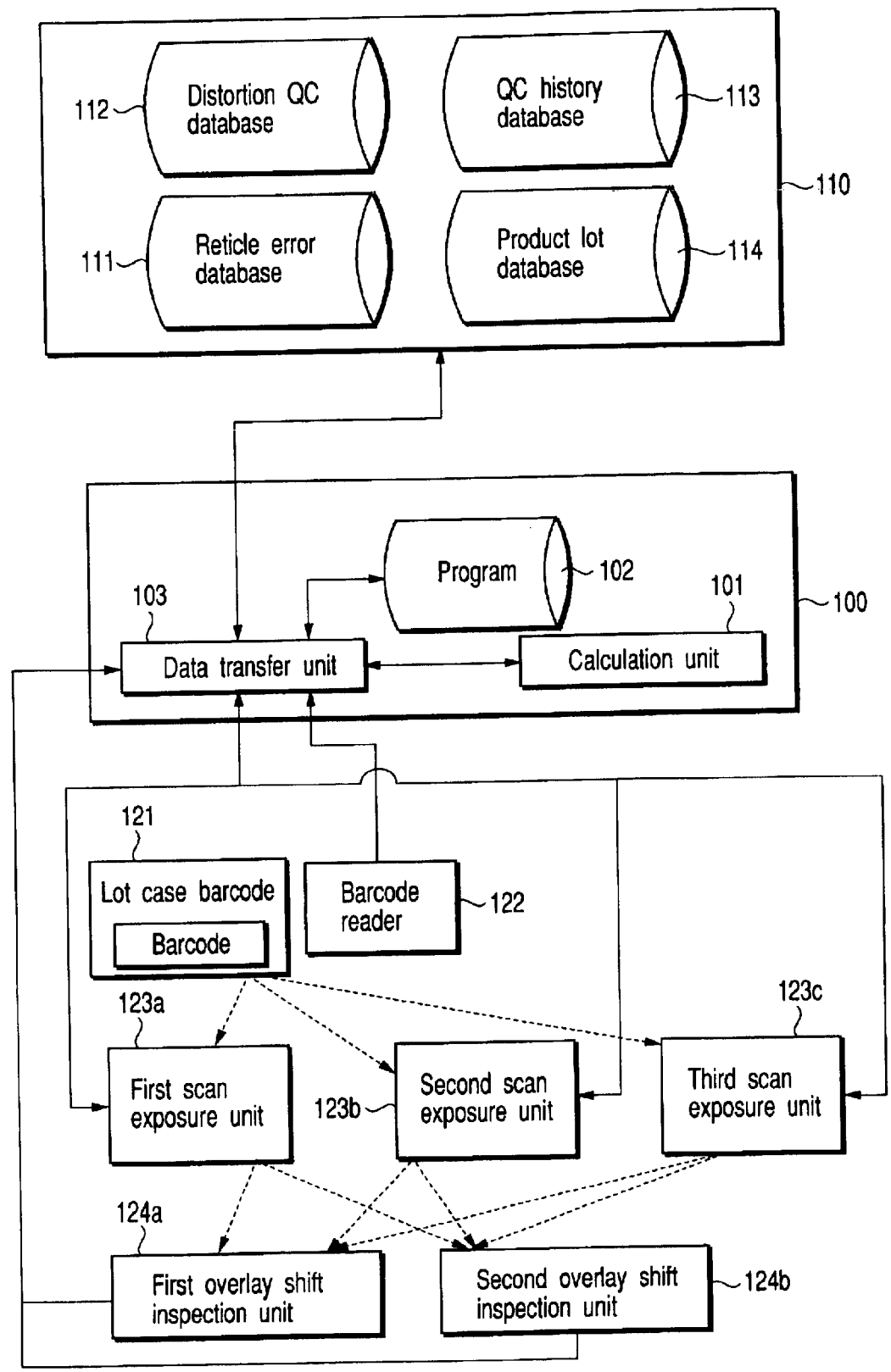
F I G. 1

100nm

100nm

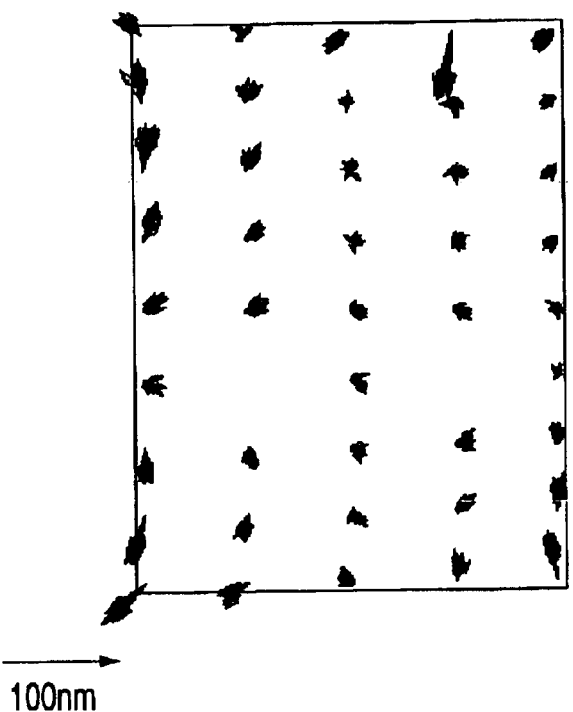
100nm
F I G. 9
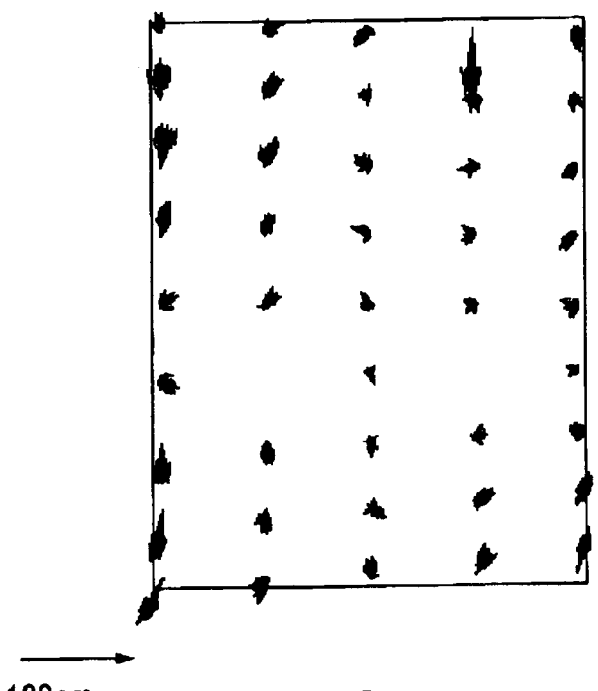
100nm
F I G. 10

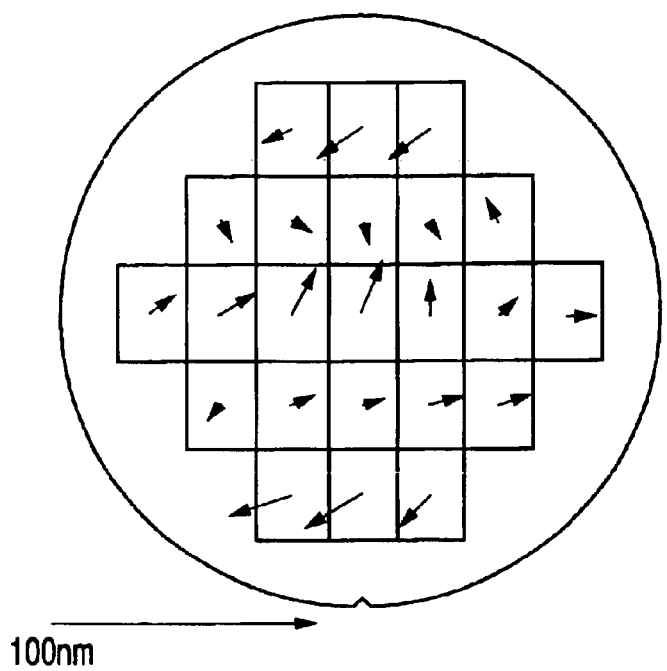
100nm
F I G. 12
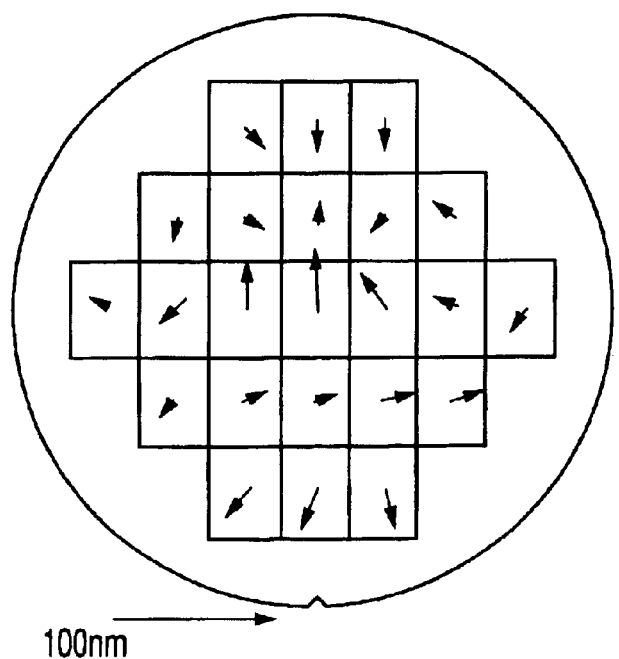
100nm
F I G. 13

EXPOSING METHOD

CROSS-REFERENCE TO RELATED APPLICATIONS

This application is based upon and claims the benefit of priority from the prior Japanese Patent Application No. 2001-363133, filed Nov. 28, 2001, the entire contents of which are incorporated herein by reference.

BACKGROUND OF THE INVENTION

1. Field of the Invention

The present invention relates to an exposing method, and more particularly to a production support system and operation and management technique of an exposure unit in semiconductor manufacturing.

2. Description of the Related Art

In recent years, as an exposure unit used in photolithography of semiconductors, an optical exposure unit of the scan exposing type which performs exposures by moving a reticle and a wafer in the direction reverse to each other to reduce the diameter of a projection lens (hereinafter referred to as a scan exposure unit) has been developed.

Exposing with a scan exposure unit causes errors called a lens distortion error, a stage matching error and so on.

A lens has a specific distortion called a lens distortion. With a lens distortion, the position of a pattern to be transfer shifts from the designed transfer position. If the shift is large, the product will be defective.

Two different exposure units have their own distortions. When overlaying patterns with different exposure units, it is necessary for exact overlaying to know relative distortions in combination of two exposure units.

When overlaying patterns with one same exposure unit, distortion is the same in an overlaying pattern and an overlaid pattern, and generally a relative shift does not occur. However, if an interval between the overlaying pattern exposing process and the overlaid pattern exposing process increases causing the error to change with time, a shift will occur between the two patterns. If this shift is large, the product will be defective.

When two exposure units are combined for overlaying patterns, a shift occurs between two patterns. Even if one exposure unit is used, a shift occurs between two patterns due to distortion changes with time. If this shift is large, the product will be defective.

BRIEF SUMMARY OF THE INVENTION (1) According to a first aspect of the present invention, there is provided an exposing method of exposing an overlaying layer by aligning with the pattern of an overlaid layer by using an exposure unit of the scan exposing type which performs exposures in a shot area by moving a reticle and a wafer synchronously along the scanning direction, the exposing method comprising:

preparing a reticle having a matrix of four or more marks in the scanning direction and four or more in the direction orthogonal to the scanning direction;

transferring the marks formed on the reticle to each shot area of a first pilot wafer, by using a first exposure unit which is used for exposing the overlaid layer;

detecting the position coordinates of the marks transferred to each shot area of the first pilot wafer in a predetermined coordinate systems;

transferring the marks formed on the reticle to each shot area of a second pilot wafer, by using a second exposure unit which is used for exposing the overlaying layer;

detecting the position coordinates of the marks transferred to each shot area of the second pilot wafer in the predetermined coordinate systems;

referring to the position coordinates of the marks transferred by using the first and second exposure units;

calculating the difference between the respective coordinate elements of the two referenced position coordinates;

calculating from the calculated difference a correction parameter for correcting a lens aberration; and exposing the overlaying layer, in the state where the optics of the second exposure unit are being corrected based on the calculated correction parameter.

(2) According to a second aspect of the present, there is provided an exposing method of exposing an overlaying layer by aligning with the pattern of an overlaid layer by using an exposure unit of the scan exposing type which performs exposures in a shot area by moving a reticle and a wafer synchronously along the scanning direction, the exposing method comprising:

preparing a first reticle which is used for exposing the overlaid layer and has three or more marks formed along the scanning direction;

preparing a second reticle which is used for exposing the overlaying layer and has three or more marks formed along the scanning direction;

detecting the position coordinates of the marks formed on the second reticle in a predetermined coordinate systems;

transferring the marks formed on the first reticle to a first wafer;

detecting the position coordinates of the marks transferred to each shot area of the first wafer in the coordinate systems;

calculating the difference between the respective coordinate elements of the position coordinates of the marks transferred to the first wafer and the position coordinates of the marks formed on the second reticle;

calculating from the calculated difference a correction parameter for correcting the zero to third-order errors which occur while moving the reticle and wafer in the scanning direction; and exposing the overlaying layer by using the second reticle, in the state where the errors are being corrected based on the correction parameter.

(3) According to a third aspect of the present invention, there is provided an exposing method of exposing an overlaying layer by aligning with the pattern of an overlaid layer by using an exposure unit of the scan exposing type which performs exposures in a shot area by moving a reticle and a wafer synchronously along the scanning direction, the exposing method comprising:

preparing a first reticle which is used for exposing the overlaid layer and has three or more marks formed along the scanning direction;

preparing a second reticle which is used for exposing the overlaying layer and has three or more marks formed along the scanning direction;

detecting the position coordinates of the marks formed on the second reticle in the predetermined coordinate systems;

transferring the marks formed on the first reticle to the overlaid layer of the first wafer;

detecting the position coordinates of the marks transferred to each shot area of the overlaid layer in the coordinate systems;

calculating the barycentric coordinates of each shot area from the position information of the marks transferred to each shot area of the overlaid layer;

calculating the barycentric coordinates of the marks based on the position coordinates of each mark formed on the second reticle;

calculating the difference between the two barycentric coordinates;

calculating from the calculated difference a correction parameter for correcting the 0th- to third-order errors which occur while moving the wafer in the stepping direction; and exposing the overlaying layer, in the state where the errors are being corrected based on the correction parameter.

BRIEF DESCRIPTION OF THE SEVERAL VIEWS OF THE DRAWING

FIG. 1 is a block diagram schematically showing the configuration of an exposure system according to a first embodiment of the present invention;

FIG. 9 is a view showing the vectors of the residual errors in a shot area formed between exposure units by a conventional exposing method;

FIG. 10 is a view showing the vectors of the residual errors in a shot area formed between exposure units by the correction method according to the second embodiment of the invention;

FIG. 12 is a view showing the vector of the wafer components exposed between exposure units by a conventional exposing method; and FIG. 13 is a view showing the vector of the wafer components exposed between exposure units by the exposing method according to the third embodiment.

DETAILED DESCRIPTION OF THE INVENTION

Figure 2:
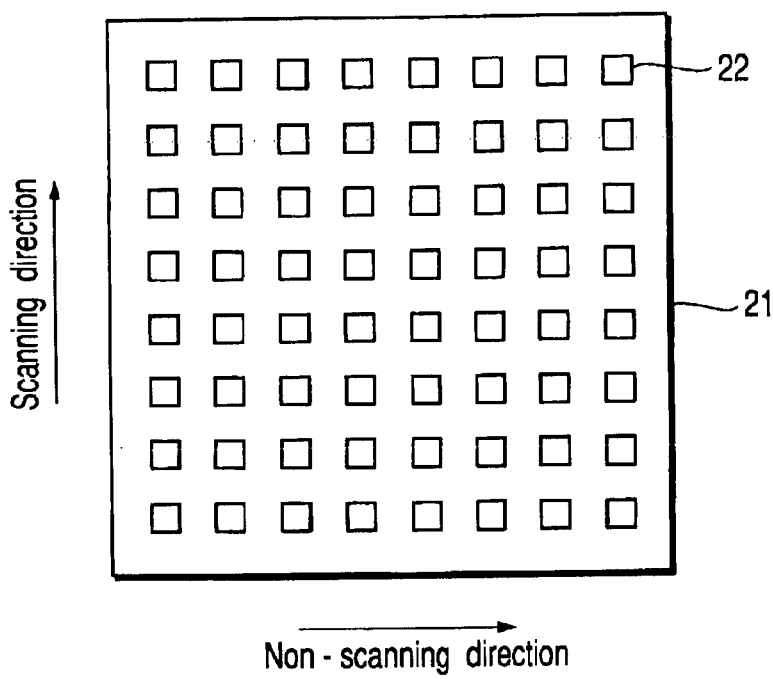
FIG. 2 is a plan view schematically showing the marks formed on a reticle used to obtain data on lens distortion QC.

Hereinafter embodiments of the present invention will be explained with reference to the accompanying drawings.

(First Embodiment)

There is shown an example of a lens distortion correction system for the purpose of improving the accuracy of overlaying in a shot area. Lens distortion correction of this embodiment is characterized by obtaining a correction parameter by using the difference between the latest QC data used when exposing a m-layer and the latest QC data used when exposing a m−1 layer.

FIG. 1 is a block diagram schematically showing the configuration of the exposing system according to the first embodiment of the invention. This system aims at centralized control of lens distortion correction. In FIG. 1, the solid arrow indicates the flow of data, and the dotted arrow indicates the flow of lot.

A data server 110 comprises four databases: a reticle error database 111, a distortion QC database 112, a QC history database 113 and a product lot database 114. The reticle error database 111 stores an overlay mark array error of a reticle used to measure a lens distortion. The distortion QC database 112 stores the lens distortion QC data as an overlay shift inspection result. The QC history database 113 controls the lens distortion QC history. The product lot database 114 controls the product lot process flow and history.

In QC aiming at correcting the first- to third-order lens distortion, it is necessary to prepare a reticle having a matrix of at least four points of overlay marks formed in the scanning direction within a shot (the y-axis direction) and a non-scanning direction (the x-axis direction) to measure the mark transfer position.

Description will now be given on how to obtain the lens distortion QC data in this embodiment. FIG. 2 schematically shows the marks formed on the reticle used for obtaining the lens distortion QC data. As shown in FIG. 2, in a shot area 21, total 64 overlay marks 22 are arrayed, 8 each in the reticle scanning direction and in the non-scanning direction.

The reticle having the overlay marks 22 is used in combination with each exposure unit, exposing the resist formed on a wafer to light. A latent image is thus formed on the resist. The position coordinates $(X_i, Y_i)$ (i=1 to 64) of the latent image which corresponds to each mark are determined. The shift $(\Delta x_i, \Delta y_i)=(x_i-X_i, y_i-Y_i)$ (i=1 to 64) between the position coordinates $(X_i, Y_i)$ (i=1 to 64) and the position coordinates (the measurement point) $(x_i, y_i)$ (i=1 to 64) is measured. Note, a latent image corresponding to each mark is formed at the measurement point when no lens distortion exists and no mask manufacturing error occurs. Twelve exposures are performed on three wafers, each. The shift is calculated for each wafer. The average of the three shifts is used as lens distortion QC data.

The product lot database 104 controls the exposure date, illumination condition, exposure unit and reticle ID number for each exposed layer.

A system controller 100 comprises a calculation unit 101, a program 102 which causes the calculation unit 101 to execute a predetermined function, first, second and third scan exposure units 123a, 123b, 123c, first and second overlay inspection units 124a, 124b, a data server 110, and a data transfer unit 103 which transfers data between the calculation unit 101 contained in the system controller and a program 102. The calculation unit 101 calculates a lens distortion correction parameter by the program 103, subtracts a reticle manufacturing error, and outputs a command to the scan exposure units 123 (123a to 123c), the overlay inspection unit 124 (124a, 124b), the data server 110 and the data transfer unit 103 in the system controller 100.

Each exposure unit 123 has the mechanism which controls a pressure control room for controlling the pressure of the projection lens or between the projection lenses which are driven to correct the lens distortion, or changes the wavelength of an excimer laser beam. That is, each scan exposure unit 123 has the mechanism which further controls the pressure control room for pressure control of the projection lens or between the projection lenses which are driven, so that the excimer laser beam passing through the pressure control room which controls the pressure of the projection lens and between the projection lenses which are driven to further correct the lens distortion, or the scan image surface by the excimer laser beam shoes wavelength is changed becomes a scan image surface for which the lens distortion is not corrected, or changes the wavelength of the excimer laser beam. With the above mechanism, each scan exposure unit 123 offsets the second- to third-order lens distortion error correction by the scan image surface correction.

The calculation of the lens distortion correction parameter and the subtraction of the reticle manufacturing error are not necessarily executed by the system controller 100. The calculation of the lens distortion correction parameter and the subtraction of the reticle manufacturing error can be executed by the scan exposure unit 123 or the overlay inspection unit 124, for example. The measurement executed by the overlay inspection unit 124 can use the overlaying measurement function of the scan exposure unit 123.

Figure 3:
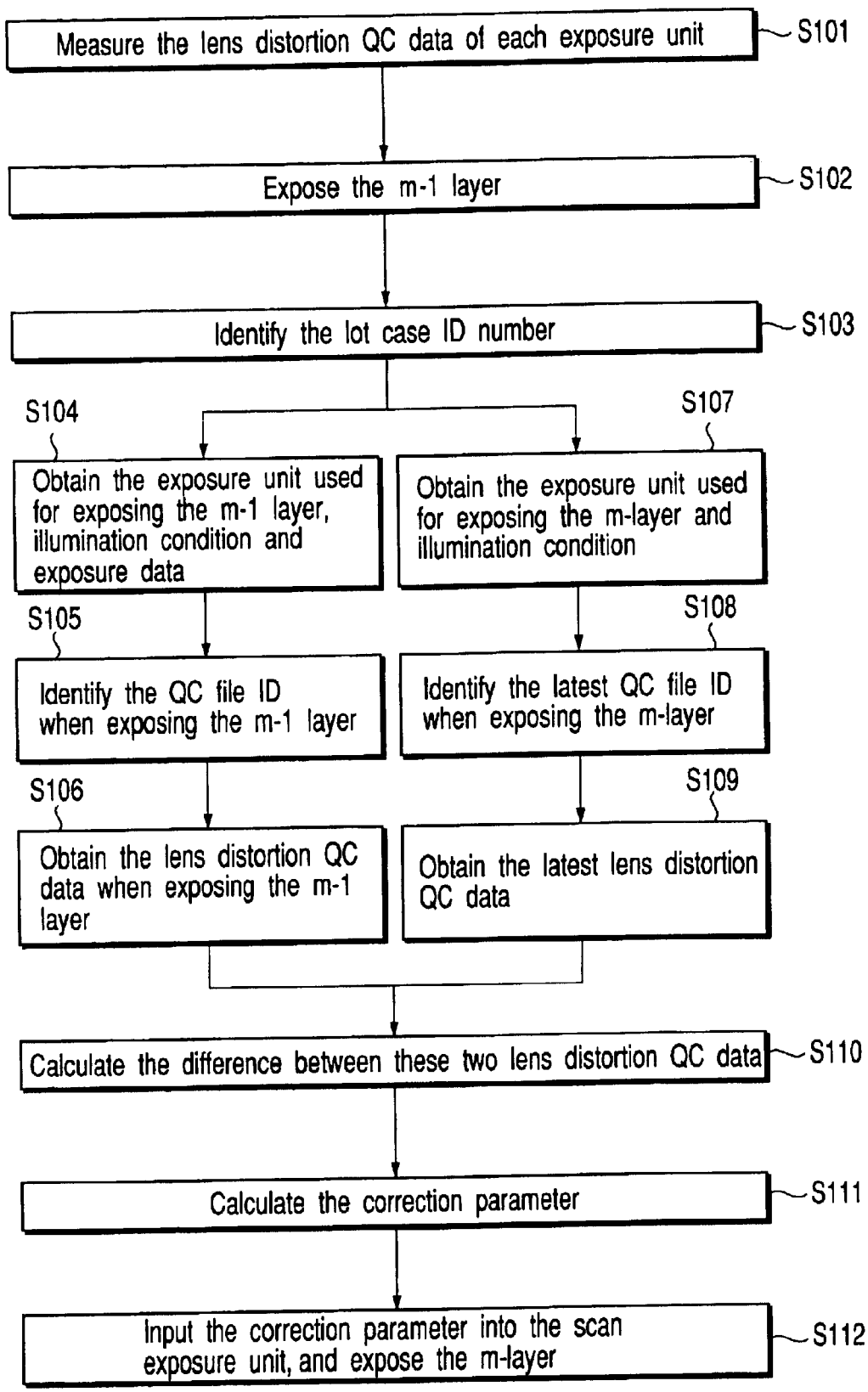
FIG. 3 is a flow chart showing an exposing method according to the first embodiment of the invention.

Referring now to FIG. 3, the exposing method using the system shown in FIG. 1 will be explained. FIG. 3 is a flow chart showing the exposing method according to the first embodiment of the invention. The flow chart shows the steps of adjusting the lens distortion to the m−1 layer.

(Step S101)

The marks formed in the reticle shown in FIG. 2 is transferred into each shot area of the pilot wafer, by using the scan exposure units 123a to 124c. Measure the position coordinates of each mark by using the overlay shift inspection units 124a, 124b. It is also permitted to use the overlay measurement function of the scan exposure unit 123. The mark position coordinates are expressed by rectangular coordinates taking the scanning direction along the y-axis and the direction orthogonal to the scanning direction along the x-axis. The same rectangular coordinates are used for measurement of the following position coordinates.

Then, the shift amount $(\Delta x_i, \Delta y_i)$ (i=1 to 64) is calculated as described above. The average value of the calculated shift amounts of each position coordinates is used as a lens distortion QC data. The lens distortion QC data calculated for each scan exposure unit 123 are stored in the QC database.

(Step S102)

The m−1 layer is exposed to light, by one of the scan exposure units 123a to 123c. The product lot history data, including the scan exposure unit used, illumination condition and exposure date, is stored into the product-lot database 114.

(Step S103)

The barcode attached to the lot case 121 is read by means of a barcode reader 122. The product lot ID number is identified with the barcode read.

(Step S104)

The product lot history data corresponding to the product lot ID number identified in step S101 is identified, referring to the product lot database 114.

(Step S105)

The QC history database 103 is searched for the latest QC file ID in accordance with the three items of the product lot history data, by tracing back to the time to expose the m−1 layer.

(Step S106)

The distortion QC database 112 is searched, based on the QC file ID, for the lens distortion QC data for the scan exposure unit used to expose the m−1 layer. The lens distortion QC data has been corrected when stored into the distortion QC database 112, thus eliminating errors made during the manufacture of the apparatus. Note that this data has been corrected against the reticle error file read from the reticle error database 111.

After the barcode reader 122 identifies the production ID number, the latest QC data for exposing the m-layer (S105 to S107) is searched for, at the same time the QC distortion data for exposing the m−1 layer (S102 to S104) is searched for.

(Step S107)

The product-lot database 114 is searched for the process flow data, in accordance with the product lot ID number. The process flow data includes two data, the scan exposure unit and illumination condition for exposing the m-layer.

(Step S108)

The QC history database 113 is searched for the latest QC file ID, based on the two items of the process flow data, by tracing back to the time to expose the m-layer.

(Step S109)

The distortion QC database 112 is searched for the lens distortion QC data used to expose the m-layer, in accordance with the identified QC file ID. The lens distortion QC data has been corrected at the time of being saved, in accordance with the reticle error file read from the reticle error database. Thus, errors made during the manufacture of the apparatus have been eliminated.

(Step S110)

The difference (dx, dy) between the QC distortion data used to expose the m-layer and the m−1 layer obtained in step S109 is determined.

(Step S111)

The difference determined and the coordinates of the measurement point are substituted in the following correction equation (1) or (2):

$$\left. \begin{array}{l} dx = k_1 + k_3 x + k_5 y + k_7 x^2 + k_{13} x^3 \\ dy = k_2 + k_4 y + k_6 x + k_{12} x^2 \end{array} \right\} \quad (1)$$

$$\left. \begin{array}{l} dx = k_1 + k_3 x + k_5 y + k_{13} x^3 \\ dy = k_2 + k_4 y + k_6 x + k_{10} xy \end{array} \right\} \quad (2)$$

Where, dx is a amount of shift of the direction of an x-axis in a shot, dy is a amount of shift of the direction of an y-axis in a shot, x is a oordinates value of the x-axis in a shot, y is Coordinates value of the y-axis in a shot.

Fitting using least-squares approximating is performed, obtaining parameters $k_1$, $k_2$, $k_3$, $k_4$, $k_5$, $k_6$, $k_7$, $k_{12}$, $k_{10}$ and $k_{13}$ for correcting the lens aberration.

The correction equation (1) consists of the 0th-order correction terms of $k_1$ for correcting the shift component in the x direction and $k_2$ for correcting the shift component in the y direction, and first-order correction terms including $k_3$ for correcting the magnification component in the x direction, $k_4$ for correcting the magnification component in the y direction, and $k_5$, $k_6$ for correcting the rotation component and rectangularity component. A conventional correction equation uses $k_1$ to $k_6$ for correction.

In this embodiment, the correction equation includes, in addition to the coefficients $k_1$ to $k_6$, the second- to third-order terms of a correction term $k_7$ for correction by inclining the aberration correction mechanism, which corrects Seidel or Zernike aberration, to the x direction, and a correction term $k_{12}$ for correction by inclining the aberration correction mechanism to the y direction, and a correction term $k_{13}$ for correction by driving up/down the aberration correction mechanism.

The correction equation (2) is applied, depending on the correction format of the correction mechanism of a scan exposure unit. The correction terms $k_1$ to $k_6$ are identical to those in the equation (1). The correction term $k_{10}$ makes correction by driving a wafer stage, and the correction term $k_{13}$ makes correction by changing the excimer laser beam wavelength.

In the above example, the reticle manufacturing error is corrected when the lens distortion QC data is stored. Nonetheless, this error may be reduced at a different timing, for example, when a distortion difference is calculated.
(Step S112)

The requested correction parameter is input to the scan exposure unit 123 that is used to expose the m-layer. The m-layer is then exposed in the state where the optics of the exposure unit are being corrected based on the calculated correction parameter.

Figure 4:
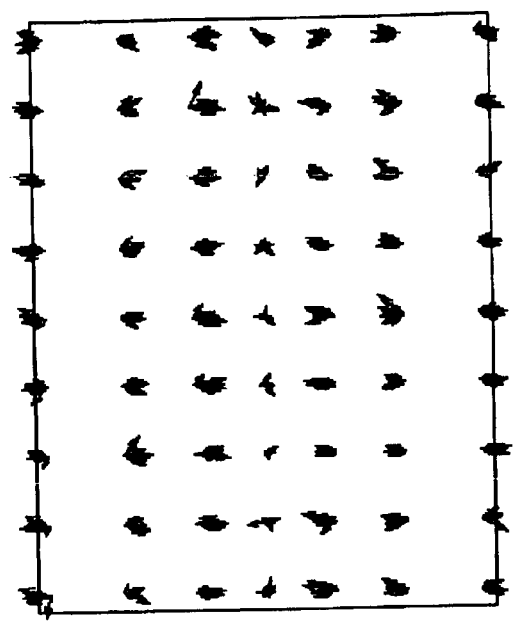
FIG. 4 is a view showing the vectors of the difference between distortion illuminations in a shot area in a KrF scan exposure unit, in which exposure is performed by a conventional correction method.

Next, the results of verifying the second- to third-order lens distortion error correction effect will be explained. FIG. 4 shows the vector of the difference between distortion illuminations in a shot area in a KrF scan exposure unit. The vector is the residual error component obtained by fitting least squares in the lens distortion correction equation, by means of a conventional scan exposure unit. The residual error component is given by the following equation (3):

$$\left. \begin{array}{l} dx = k_1 + k_3 x + k_5 y \\ dy = k_2 + k_4 y + k_6 x \end{array} \right\} \quad (3)$$

Where, dx is a amount of shift of the direction of an x-axis in a shot, dy is a amount of shift of the direction of an y-axis in a shot, x is a coordinates value of the x-axis in a shot, y is a coordinates value of the y-axis in a shot.

Figure 5:
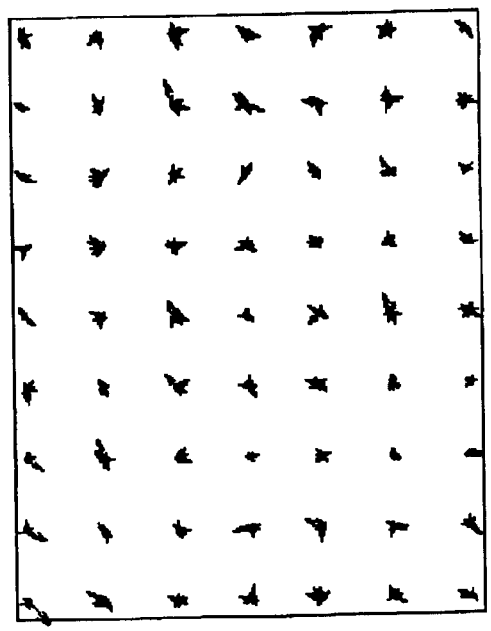
FIG. 5 is a view showing the vectors of the difference between distortion illuminations in a shot area, when exposure is performed by the exposing method of the first embodiment of the invention.

FIG. 5 shows the residual error component obtained by fitting the parameters to the correction equation (1) by the method of least squares. FIG. 5 is a diagram showing the vectors of the difference between distortion illuminations in a shot area, when exposure is made by the exposing method of the first embodiment of the invention. This shows the residual error component as a result of fitting least squares to the lens distortion correction equation (1) using the present invention. Table 1 shows the reduction of the residual lens distortion error in a shot using a conventional method and the method of the embodiment of the present invention.

TABLE 1

| | (nm) | |
|---|---|---|
| | Residual component 3σX | Residual component 3σY |
| Conventional correction method | 46 | 13 |
| Correction method of the first embodiment | 15 | 13 |

The value of 3σ decreases in the correction method of the present invention, as shown in Table 1. This indicates usefulness of the correction method of the embodiment of the present invention.

The embodiment of the invention can increase the overlay accuracy by reducing the lens distortion error in the case of using the overlay error, particularly in the mix-and-match method. That is, the number of retries due to mismatching and to increase the unit utility rate and the productivity may be reduced.

It is also possible to make correction against the changes in lens aberration with time. The reticle can be shared among a plurality of units by adjusting the aberration with other machines. This can decrease the reticle manufacturing cost and the number of retries due to incorrect dimensions, and can increase the unit utility rate and the productivity. Further, mis-entries and the processing time can be reduced if online production is employed.

In the embodiment, the m-layer is adjusted in position with respect to the m−1 layer. Nevertheless, the overlaying layer is not limited to the m−1 layer. To overlay the m-layer on the layer exposed before the a-layer, the m−1 layer can be replaced by the m−a layer. There may be a case where high overlay accuracy is demanded when the m-layer is to the m+a layer. In this case, the lens distortion correction parameter is calculated from the difference between the latest distortion data of the scan exposure unit and illumination condition to expose the m+a layer when exposing the m-layer, and the latest distortion data of the scan exposure unit and illumination condition to expose the m-layer. Correction may be performed by substituting the correction parameters into the equation (1) or (2) for each shot of the same scanning direction or the same stepping direction and separating the obtained correction values into the scanning direction and the stepping direction.
(Second Embodiment)

In this embodiment, a reticle stage moving mirror curvature correction system is used to improve the accuracy of overlaying in a shot area, is shown. Reticle stage moving mirror curvature correction is peculiar to the scan exposure unit; it is not effected in the step-and-repeat exposing method.

Figure 6:
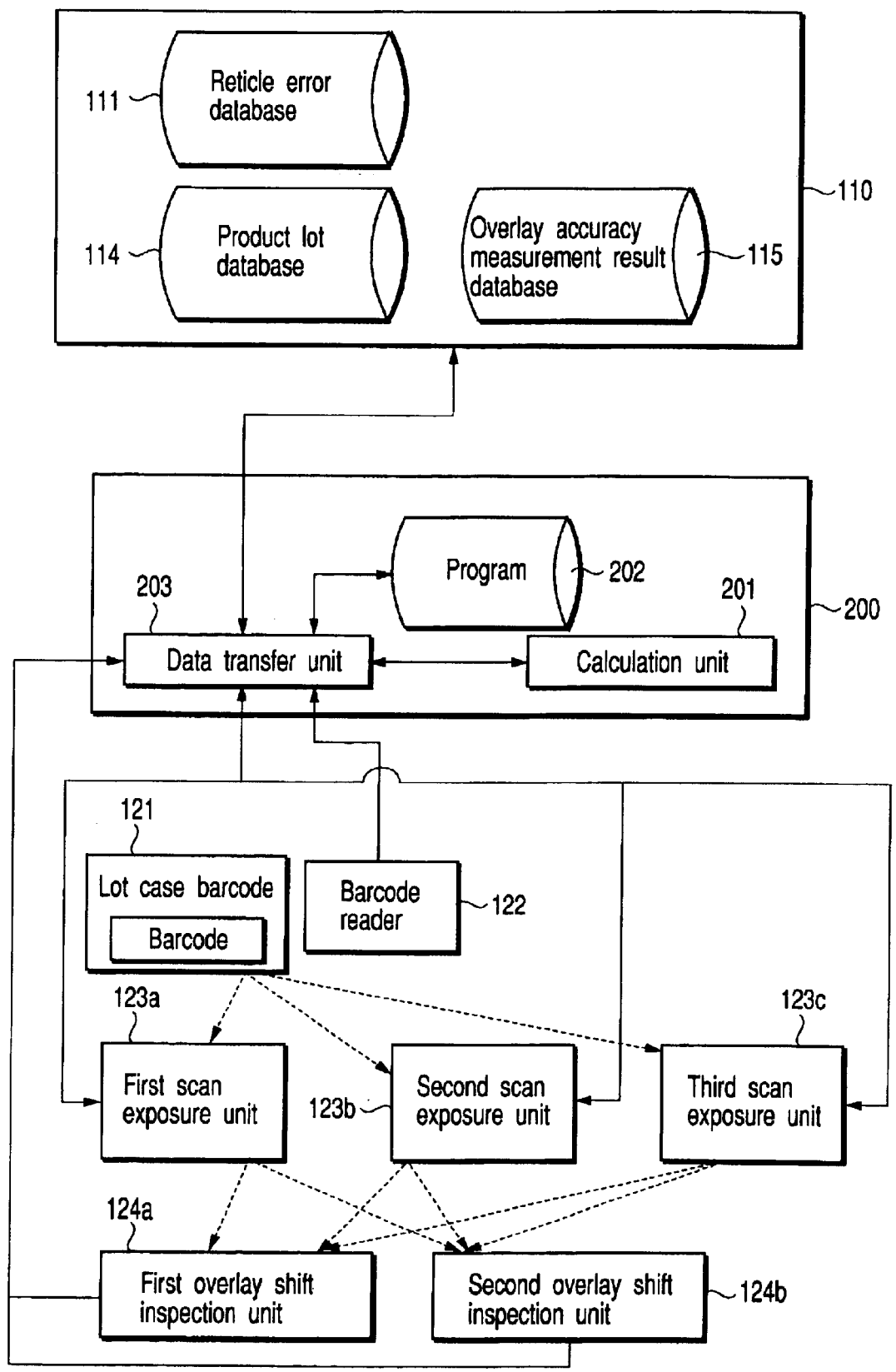
FIG. 6 is a block diagram schematically showing the configuration of an exposure system according to a second embodiment of the present invention.

FIG. 6 is a block diagram showing the configuration of an exposure system that is the second embodiment of the present invention. This system aims at centralized control of reticle stage moving mirror curvature correction. The component identical to those of the first embodiment (FIG. 1) are designated at the same reference numerals and will not be described in detail.

As FIG. 6 shows, a system controller 200 comprises a calculation unit 201, a program 202 which causes the calculation unit 201 to execute a predetermined function, first, second and third scan exposure units 123*a*, 123*b* and 123*c*, first and second overlay inspection units 124*a* and 124*b*, a data server 110, and a data transfer unit 203. The unit 203 transfers data between the calculation unit 201 contained in the system controller and a program 202. The calculation unit 201 calculates a lens distortion correction parameter by the program 203, subtracts a reticle manufacturing error, and outputs a command to the scan exposure units 123 (123*a* to 123*c*), the overlay inspection units 124 (124*a*, 124*b*), the data server 110 and the data transfer unit 203 in the system controller 200.

The system controller 200 need not calculate the correction parameter or subtract the reticle manufacturing error. The scan exposure unit or the overlay inspection unit, for example, may calculate the parameter and subtract the error. The overlay measurement function of the scan exposure unit is utilized to measure measurement in the overlay inspection unit.

Figure 7:
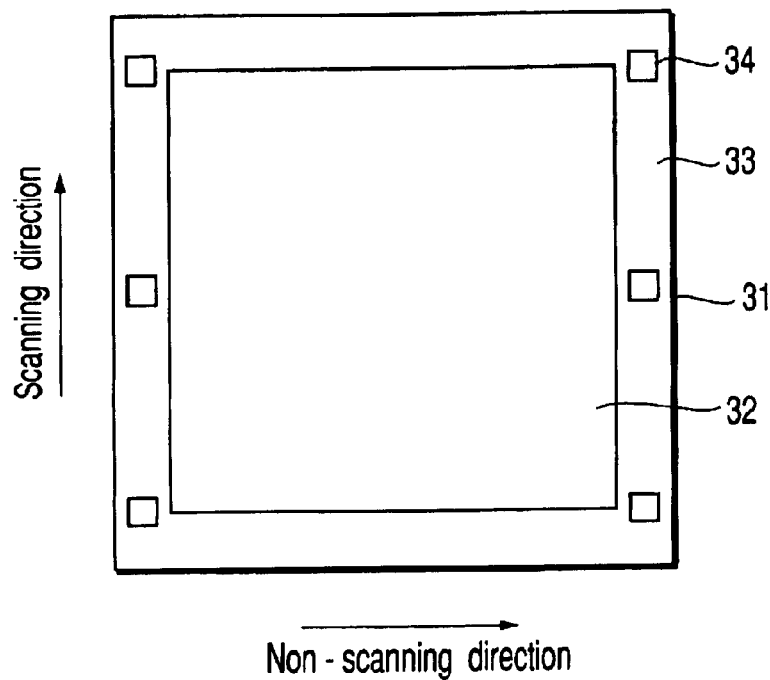
FIG. 7 is a plan view showing three points of overlay marks formed in a shot area on the reticle of a product lot.

To correct the reticle stage moving mirror curvature, three overlay marks 34 are provided in the scanning direction, in a shot area 31 of a product lot reticle, as is illustrated in FIG. 7. At least three overlay marks 34 are necessary. An overlay mark is provided on the reticle used for exposing each layer, at substantially the same position coordinates.

The overlay marks 34 are provided in a dicing area 33, outside a device area 32. A pilot wafer is exposed, by using a production reticle of each layer. An overlay inspection unit 123 measures the coordinates of the overlay mark transferred onto a resist.

Figure 8:
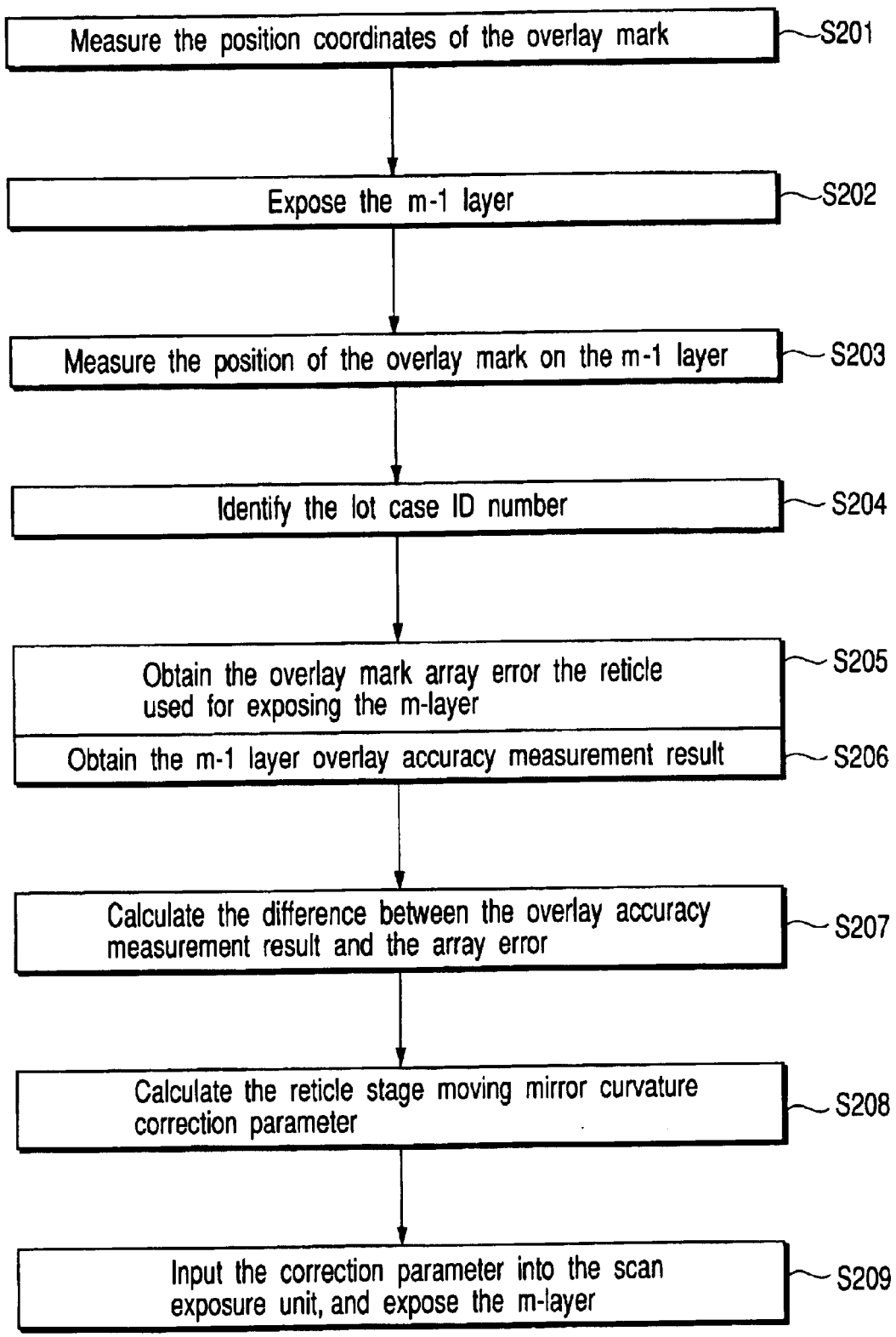
FIG. 8 is a flow chart showing an exposing method according to the second embodiment of the invention.

FIG. 8 is a flowchart explaining an exposing method according to the second embodiment of the invention. In this method, the reticle stage moving mirror curvature is adjusted to the m−1 layer before the m-layer is exposed to light.
(Step S201)

Reticles to be used to expose the m-layer and m−1 layer are prepared. Each reticle has three overlay marks along the scanning direction, as shown in FIG. 7.

The position coordinates of the overlay marks formed on each reticle are measured. The data representing the overlay mark array error on a production reticle is stored into the reticle error database 111.
(Step S202)

The m−1 layer product reticle is incorporated into any one of the scan exposure units 123a to 123c. The m−1 layer is exposed to light. The overlay marks formed on the product reticle are thereby transferred to the m−1 layer.
(Step S203)

The overlay inspection units 124a and 124b measure the position coordinates of the overlay marks transferred to the m−1 layer. The overlay accuracy is determined. The product lot ID number is combined with the overlay accuracy, generating new data. The new data is stored into an overlay accuracy database 115.
(Step S204)

A barcode reader 120 reads the barcode attached to the lot case, before the m-layer is exposed. The product lot ID number is identified with the barcode thus read.
(Step S205)

Referring to the product lot ID number thus identified and included in the product-lot database 114, the reticle ID number of the product reticle used to expose the m-layer is read from the database 114. Referring to the reticle error database 111, the overlay mark array error of the product reticle is read from the database 114, in preparation for exposing the m-layer.
(Step S206)

The overlay accuracy database 115 is searched to the result of overlay accuracy measurement of the overlay marks formed in the product lot when the m−1 layer is exposed.
(Step S207)

The difference between the overlay accuracy measurement result and the overlay mark array error of the product reticle for exposing the m-layer is calculated.
(Step S208)

The calculated difference and the measurement point coordinates are substituted in the correction equation (4):

$$\left. \begin{array}{l} dx = k_1 + k_3 x + k_5 y + k_{11} y^2 + k_{19} y^3 \\ dy = k_2 + k_4 y + k_6 x \end{array} \right\} \quad (4)$$

Where dx is a amount of shift of the direction of an x-axis in a shot, dy is a amount of shift of the direction of an y-axis in a shot, x is a coordinates value of the x-axis in a shot, y is a coordinates value of the y-axis in a shot.

Fitting is effected by using a least-squares approximating, thus finding the reticle stage moving mirror correction parameters of the correction terms $k_1$ to $k_6$, $k_{11}$, and $k_{19}$.

The correction equation (4) consists of the 0th-order correction terms of $k_1$ for correcting the shift component in the x direction and $k_2$ for correcting the shift component in the y direction, and first-order correction terms including $k_3$ for correcting the magnification component in the x direction, $k_4$ for correcting the magnification component in the y direction, and $k_5$, $k_6$ for correcting the rotation component and rectangularity component. A conventional correction equation uses the above $k_1$ to $k_6$ for correction. In this embodiment, the correction equation uses, in addition to the correction terms $k_1$ to $k_6$, the second- to third-order correction terms of $k_{11}$ for correcting the reticle stage moving mirror curvature error, and $k_{19}$ for correcting the reticle stage moving mirror curvature error approximated by a cubic in the scanning direction.
(Step S209)

The correction parameters thus found are input to the scan exposure unit. Exposure is carried in the state where the optics of the exposure unit are being corrected based on the calculated correction parameter.

Next, the results of verifying the effect of correction to adjust the reticle moving mirror curvature to the m−1 layer will be explained. FIG. 9 is a diagram showing the vector of the residual errors in a shot area formed by a conventional exposing method between exposure units. The vector corresponds to the residual error component found by fitting least squares in the correction equation, in a conventional exposing method, as shown in the equation (4). FIG. 10 is a diagram depicting the vector of the residual errors in a shot area between the scan exposure units formed by the correction method according to the second embodiment of the invention. This vector corresponds to the residual error component found by fitting least squares in the equation for correcting the moving mirror curvature of reticle stage, in the method of the present invention, as shown in the equation (4).

Table 2 shows the reduction of the residual error in a shot using a conventional method and the reticle stage moving mirror curvature correction method between the scan exposure units shown in this embodiment of the present invention.

TABLE 2

| (nm) | |
|---|---|
| | Residual component |
| Not corrected | 32 |
| Corrected | 22 |

The value of 3Q applied in the correction method of the present invention decreases. This means that the correction method that corrects the reticle stage moving curvature in this embodiment of the invention is more useful than a conventional method that does not correct the reticle stage moving mirror curvature.

In the preset embodiment, the m-layer is adjusted in position with respect to the m−1 layer. Nonetheless, the overlaying layer is not limited to the m−1 layer. If the m-layer laid over the layer that is exposed before the a-layer, the m−1 layer is used in the above-mentioned embodiment as a m−a layer. In this case, the shift between the overlay measurement mark when exposing the m−a layer and the overlay measurement mark when exposing the m-layer is measured. The result is substituted in the correction equation (4), and the correction parameter is calculated. Correction may be achieved by substituting the parameter in the equation (4) for each shot of the same scanning direction or the same stepping direction, and by distributing the obtained correction value into the scanning direction and the stepping direction.

The embodiment of the invention can increase the overlay accuracy by reducing the error in moving in the scanning direction if the overlay error is utilized, particularly in the mix-and-match method. That is, the number of retries due to mismatching may decrease, and the unit utility rate and the productivity (Third Embodiment)

In this embodiment, a wafer stage error correction system is used to improve the accuracy of wafer overlaying. The term "wafer stage error" means an error in the stepping direction, also known as "curvature error of wafer stage moving mirror," "forward/reverse scan error in the stepping error," or "shift of row and column."

A stage-caused error peculiar to the scan exposure unit when exposing the m−1 layer, is adjusted positively when exposing the m-layer by using the product lot overlay inspection results. When the number of product overlay measurement points is few and the reliability is low, refer to the latest QC data by tracing back to the time to expose, the error component caused by the wafer stage of the scan exposure unit used to expose the m-layer, to the error component caused by the wafer stage of the scan exposure unit used to expose the m−1 layer.

A production support system that performs centralized control of wafer stage error correction is similar to the production support system employed in the second embodiment, and will be described in detail. Error correction is achieved by using the parameters $k_1$ and $k_2$ obtained in the second embodiment, or the average value of the overlay shifts for shots.

Figure 11:
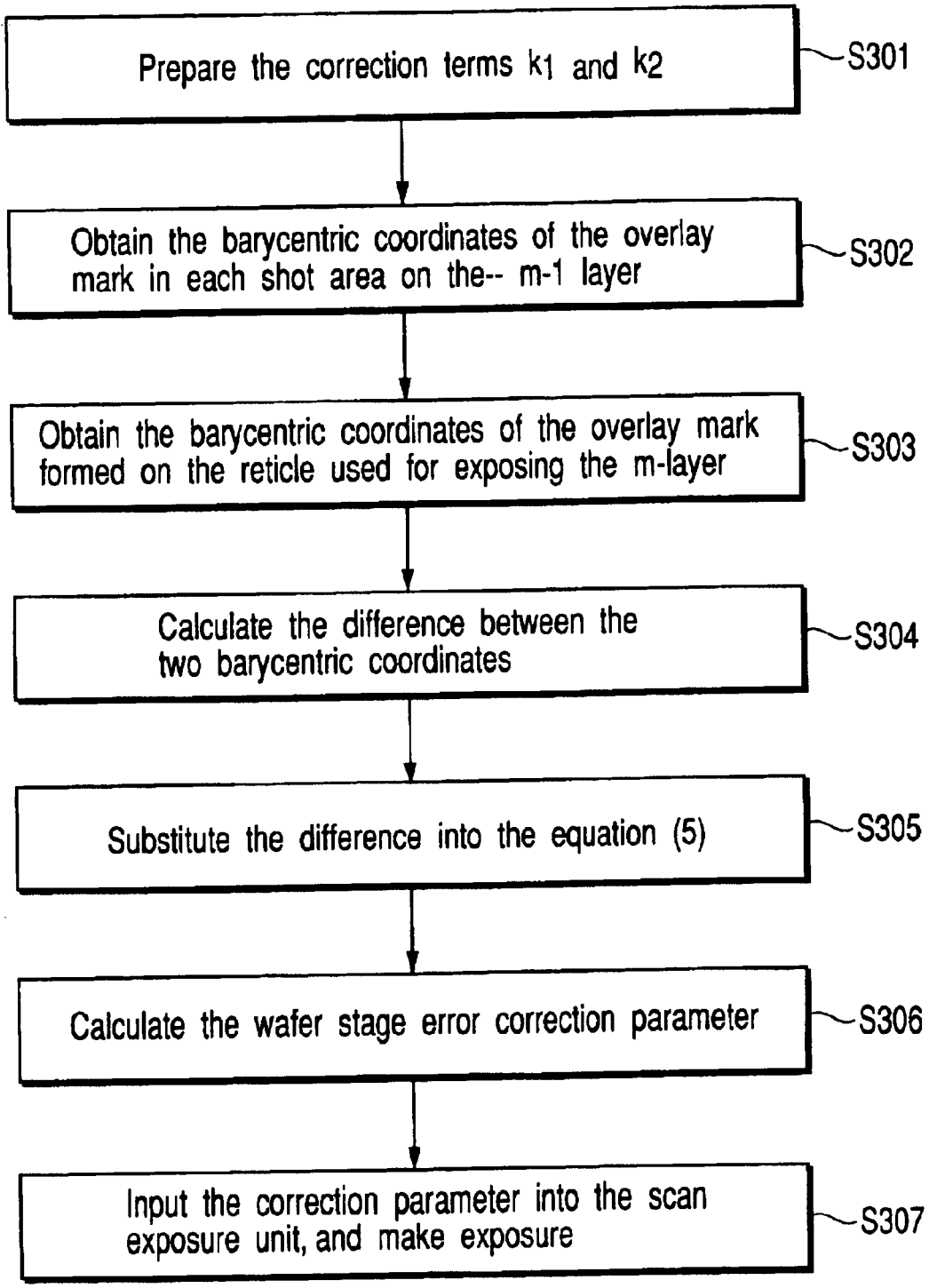
FIG. 11 is a flow chart showing an exposing method according to a third embodiment of the invention.

FIG. 11 is a flowchart explaining an exposing method according to a third embodiment of the invention. In this method, a wafer stage error is adjusted to the m−1 layer before the m-layer is exposed to light.

(Step S301)

The correction terms $k_1$ and $k_2$ are prepared in the same way as in the first embodiment.

(Step S302)

The barycentric coordinates of each overlay mark included in each shot area are calculated for each shot area when exposing the m−1 layer.

(Step S303)

The barycentric coordinates of the overlay mark exposed on the reticle used to expose the m-layer are calculated.

(Step S304)

The difference (DX, DY) between the two barycentric coordinates obtained in steps S302 and S303 is obtained for each shot.

(Step S305)

The correction terms $k_1$ and $k_2$, the barycentric coordinates (X, Y) of the overlay mark formed in the shot area when there is not shifts, and the difference (DX, DY) are substituted in the correction equation (5).

$$DX = K_1 + K_3 X + K_5 Y + K_{11} Y^2 \pm S_{\pm x} \pm S_{xstepx} \pm S_{ystepx}$$
$$DY = K_2 + K_4 Y + K_6 X + K_{12} X^2 \pm S_{\pm Y} \pm S_{xstepy} \pm S_{ystepy}$$

(5)

Where, x is a coordinates value of the x-axis in a shot, y is a coordinates value of the y-axis in a shot, $S_{\pm x}$ is a forward/reverse scan error correction value X (sign + for the Forward scanning, sign − for the reverse scanning), $S_{\pm y}$ is a forward/reverse scan error correction value Y (sign + for forward scanning, sign − for reverse scanning), $S_{\pm xstepx}$ is a correction value X on stepping in the direction of x-axis (sign + for the rightward stepping, sign − for the leftward stepping), $S_{\pm ystepx}$ is a correction value X on stepping in the direction of y-axis (sign + for the upward stepping, sign − for the downward stepping), S±xstepy is a correction value Y on stepping in the direction of x-axis (sign + for the rightward stepping, sign − for the leftward stepping), $S_{\pm ystepy}$ is a correction value Y on stepping in the direction of x-axis (sign + for the upward stepping, sign − for the downward stepping).

In this embodiment, the correction equation includes, in addition to the conventional correction terms $K_1$ to $K_6$, $K_{11}$ for correcting the wafer stage moving mirror curvature error approximated by a quadratic in the X direction, the second-order terms of $K_{12}$ for correcting the wafer stage moving mirror curvature error approximated by a quadratic in the Y direction, the forward/reverse scan error correction term $S_{\pm x}$ (the forward/reverse scan error correction term in the X direction), $S_{\pm y}$ (the forward/reverse scan error correction term in the Y direction), the step direction difference correction term S±xstepx (the correction term in the X direction in the X-direction stepping), S±ystepx (the correction term in the X direction in the Y-direction stepping), $S_{\pm xstepy}$ (the correction term in the X direction in the Y-direction step), and S±ystepy (the correction term in the Y direction in the Y-direction stepping). The scanning and stepping directions used as reference for correction are not specified.

(Step S306)

Each correction term is calculated by means of fitting using a least-squares approximating. Correction parameters are then obtained.

(Step S307)

The correction parameters obtained are input to the scan exposure unit used to expose the m-layer, and expose the m-layer.

Next, the results of verifying the effect of correction to adjust the wafer moving mirror curvature to the m−1 layer during the wafer stage error correction will be explained. FIG. 12 is a diagram showing the vector of the wafer components exposed by a conventional exposing method between exposure units. The wafer component indicates the residual error component obtained by fitting least squares to the wafer component correction equation using a conventional scan exposure unit, as shown in the equation (3).

FIG. 13 is a diagram depicting the vector of the wafer components exposed by exposure units, respectively, in the method according to the third embodiment. The vector indicates the residual error component obtained by fitting least square, in the method shown in the equation (5). Table 3 shows how the residual error in a wafer is reduced by a conventional method and by the wafer stage moving mirror curvature correction method according to this invention.

TABLE 3

|  | (nm) | |
|---|---|---|
|  | Residual component 3σX | Residual component 3σY |
| Not corrected | 34 | 26 |
| Corrected | 16 | 26 |

As seen from Table 3, the correction method using the wafer stage moving curvature correction shown in this embodiment is more useful than a conventional method not correcting the wafer stage moving mirror curvature. This is because the value of 3Q of the correction method of the present invention decreases.

The number of product lot overlay measurement points may e small and the reliability may be low. In this case, the latest QC data is input to the scan exposure unit in order to expose the m−1 layer. Further, the difference between the wafer stage error component of the exposed m−1 layer and the wafer stage error components of the latest QC data is input to the apparatus in order to expose the m-layer. The scan exposure unit can then perform correction.

A stepping error that is a difference between the forward scan error and the reverse scan error, and an error in stepping direction, known as "shift of row and column," can be obtained in the following method. The difference between the latest QC data at the exposure time and the latest QC data in the scan exposure unit used to expose the m-layer is calculated. The average value in each shot is then obtained. Further, the average value for positive and negative scanning is determined. The difference between the average values for making correction is input. For the shift of row and column, the average value of each shift is calculated and the difference is input to the exposure unit for making correction.

Alternatively, an average value for the positive canning, an average value for the negative scanning and for rows, and an average value for columns ware calculated to be used in the correction equation explained in the first and second embodiments. The difference between these average values are input to the exposure unit for making correction.

The overlay accuracy may be enhanced by reducing the error in moving in the stepping direction if the overlay error is applied, particularly in the mix-and-match method. That is, the number of retries due to mismatching may decrease, and the unit utility rate and productivity may increase.

(Fourth Embodiment)

Correction that satisfies the purposes of the embodiments 1 to 3 may be accomplished. In this case, the correction equation (6) or (7) is used for correction in a shot area.

$$dx = k_1 + k_3 x + k_5 y + k_7 x^2 + k_{11} y^2 + k_{13} x^3 + k_{19} y^3 \\ dy = k_2 + k_4 y + k_6 x + k_{12} x^2 \qquad (6)$$

$$dx = k_1 + k_3 x + k_5 y + k_{11} y^2 + k_{13} x^3 + k_{19} y^3 \\ dy = k_2 + k_4 y + k_6 x + k_{10} xy \qquad (7)$$

Where, dx is a amount of shift of the direction of an x-axis in a shot, dy is a amount of shift of the direction of an y-axis in a shot, x is a coordinates value of the x-axis in a shot, y is a coordinates value of the y-axis in a shot.

(Fifth Embodiment)

A unit QC may minimize the stage-caused error to perform fast exposure (exposure without overlaying), by utilizing the correction system of the embodiments 1 to 4. In this case, the result of overlay shift inspection described in the embodiments 1 to 4 is substituted in the correction equation and is used as unit adjustment parameters. This immunizes the residual error by fitting least squares.

The present invention is not limited to the embodiments described above. Various changes and modifications can be made, without departing from the scope and spirit of the invention. Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposing method of exposing an overlaying layer by aligning with the pattern of an overlaid layer by using an exposure unit of the scan exposing type which performs exposures in a shot area by moving a reticle and a wafer synchronously along the scanning direction, the exposing method comprising:

preparing a reticle having a matrix of four or more marks in the scanning direction and four or more in the direction orthogonal to the scanning direction;

transferring the marks formed on the reticle to each shot area of a first pilot wafer, by using a first exposure unit which is used for exposing the overlaid layer;

detecting the position coordinates of the marks transferred to each shot area of the first pilot wafer in a predetermined coordinate systems;

transferring the marks formed on the reticle to each shot area of a second pilot wafer, by using a second exposure unit which is used for exposing the overlaying layer;

detecting the position coordinates of the marks transferred to each shot area of the second pilot wafer in the predetermined coordinate systems;

referring to the position coordinates of the marks transferred by using the first and second exposure units;

calculating the difference between the respective coordinate elements of the two referenced position coordinates;

calculating from the calculated difference a correction parameter for correcting a lens aberration; and exposing the overlaying layer, in the state where the optics of the second exposure unit are being corrected based on the calculated correction parameter.

2. The exposing method according to claim 1, wherein the predetermined coordinate systems is a system of rectangular coordinates taking the scanning direction along the y-axis and the direction orthogonal to the scanning direction along the x-axis; and the aberration parameter is calculated by substituting the difference (dx, dy) between the coordinate components, and the position coordinates (x, y) formed without shifting the marks, into the equations $$dx = k_1 + k_3 x + k_5 y + k_7 x^2 + k_{13} x^3$$

$$dy = k_2 + k_4 y + k_6 x + k_{12} x^2$$

and, determining the parameters $k_1$, $k_2$, $k_3$, $k_4$, $k_5$, $k_6$, $k_7$, $k_{12}$ and $k_{13}$ by least-squares approximating.

3. The exposing method according to claim 1, wherein the predetermined coordinate systems is a system of rectangular coordinates taking the scanning direction along the y-axis and the direction orthogonal to the scanning direction along the x-axis; and the aberration parameter is calculated by substituting the difference (dx, dy) between the coordinates components, and the position coordinates (x, y) formed without shifting the marks, into the equations $$dx = k_1 + k_3 x + k_5 y + k_{13} x^3$$

$$dy = k_2 + k_4 y + k_6 x + k_{10} xy$$

and, determining the parameters $k_1$, $k_2$, $k_3$, $k_4$, $k_5$, $k_6$, $k_{10}$ and $k_{13}$ by least-squares approximating.

4. The exposing method according to claim 1, wherein the aberration parameter is one of distortion, curvature of field, astigmatism, coma and Seidel or Zernike aberration.

5. The exposing method according to claim 1, wherein the overlaying layer is formed on the overlaid layer.

6. The exposing method according to claim 1, wherein the overlaid layer is formed on the overlaying layer.

7. An exposing method of exposing an overlaying layer by aligning with the pattern of an overlaid layer by using an exposure unit of the scan exposing type which performs exposures in a shot area by moving a reticle and a wafer synchronously along the scanning direction, the exposing method comprising:

preparing a first reticle which is used for exposing the overlaid layer and has three or more marks formed along the scanning direction;

preparing a second reticle which is used for exposing the overlaying layer and has three or more marks formed along the scanning direction;

detecting the position coordinates of the marks formed on the second reticle in a predetermined coordinate systems;

transferring the marks formed on the first reticle to a first wafer;

detecting the position coordinates of the marks transferred to each shot area of the first wafer in the coordinate systems;

calculating the difference between the respective coordinate elements of the position coordinates of the marks transferred to the first wafer and the position coordinates of the marks formed on the second reticle;

calculating from the calculated difference a correction parameter for correcting the 0th- to third-order errors which occur while moving the reticle and wafer in the scanning direction; and exposing the overlaying layer by using the second reticle, in the state where the errors are being corrected based on the correction parameter.

8. The exposing method according to claim 7, wherein the predetermined coordinate systems is a system of rectangular coordinates taking the scanning direction along the y-axis and the direction orthogonal to the scanning direction along the x-axis; and the correction parameter is calculated by substituting the difference (dx, dy) between the position information, and the position coordinates (x, y) formed on the wafer without shifting the marks formed on the second reticle, into the equations $$dx=k_1+k_3x+k_5y+k_{11}y^2+k_{19}y^3$$

$$dy=k_2+k_4y+k_6x$$

and, determining the correction terms $k_1$ to $k_6$, $k_{11}$ and $k_{19}$ by least-squares approximating.

9. The exposing method according to claim 7, wherein the correction parameter is used for correction of forward/reverse scan errors depending upon the forward/reverse scanning direction of the wafer stage and reticle state.

10. An exposing method of exposing an overlaying layer by aligning with the pattern of an overlaid layer by using an exposure unit of the scan exposing type which performs exposures in a shot area by moving a reticle and a wafer synchronously along the scanning direction, the exposing method comprising:

preparing a first reticle which is used for exposing the overlaid layer and has three or more marks formed along the scanning direction;

preparing a second reticle which is used for exposing the overlaying layer and has three or more marks formed along the scanning direction;

detecting the position coordinates of the marks formed on the second reticle in a predetermined coordinate systems;

transferring the marks formed on the first reticle to the overlaid layer of the first wafer;

detecting the position coordinates of the marks transferred to each shot area of the overlaid layer in the coordinate systems;

calculating the barycentric coordinates of each shot area from the position information of the marks transferred to each shot area of the overlaid layer;

calculating the barycentric coordinates of the marks based on the position coordinates of each mark formed on the second reticle;

calculating the difference between the two barycentric coordinates;

calculating from the calculated difference a correction parameter for correcting the 0th- to third-order errors which occur while moving the wafer in the stepping direction; and exposing the overlaying layer, in the state where the errors are being corrected based on the correction parameter.

11. The exposing method according to claim 10, wherein the predetermined coordinate systems is a system of rectangular coordinates taking the scanning direction along the y-axis and the direction orthogonal to the scanning direction along the x-axis; and the correction parameter is calculated by referring to the position coordinates (X, Y) formed without shifting the marks, and substituting the difference (DX, DY) between the barycentric coordinates, and the position coordinates (X, Y), into the equations $$DX=K_1+K_3X+K_5Y+K_{11}Y^2\pm S_{\pm x}\pm S_{xstepx}\pm S_{ystepx}$$

$$DY=K_2+K_4Y+K_6X+K_{12}X^2\pm S_{\pm y}\pm S_{xstepy}\pm S_{ystepy}$$

and, determining the correction terms $K_1$, $K_2$, $K_3$, $K_4$, $K_5$, $K_6$, $K_{11}$, $K_{12}$ and $S_{\pm x}$, $S_{\pm y}$, $S_{\pm xstepx}$, $S\pm_{ystepy}$, $S_{\pm ystepx}$, $S_{\pm xstepy}$ by least-squares approximating.

12. The exposing method according to claim 10, wherein the predetermined coordinate systems is a system of rectangular coordinates taking the scanning direction along the y-axis and the direction orthogonal to the scanning direction along the x-axis; and the correction parameter is calculated by preparing a reticle having a matrix of four or more marks in the scanning direction and four or more in the direction orthogonal to the scanning direction;

transferring the marks formed on the reticle into each shot area of a first pilot wafer, by using a first exposure unit which is used for exposing the overlaid layer;

detecting the position coordinates of the marks transferred to each shot area of the first pilot wafer in the coordinate systems;

transferring the marks formed on the reticle to each shot area of a second pilot wafer, by using a second exposure unit which is used for exposing the overlaying layer;

detecting the position coordinates of the marks transferred to each shot area of the second pilot wafer in the coordinate systems;

referring to the position coordinates of the marks transferred by using the first and second exposure units;

calculating the difference (dx, dy) between the respective coordinate elements of the two referenced position coordinates;

substituting the difference (dx, dy), and the position coordinates (x, y) formed without shifting the marks, into the equations $$dx=K_1+K_3x+K_5y+K_7x^2+K_{13}x^3$$

$$dy=K_2+K_4y+K_6x+K_{12}x^2$$

and, determining the correction terms $K_1$ and $K_2$ by approximation by least-squares approximating; and substituting the difference (DX, DY) between the barycentric coordinates, and the position coordinates (X, Y) formed without shifting the marks, and the correction terms $K_1$ and $K_2$, into the equations $$DX=K_1+K_3X+K_5Y+K_{11}Y^2 \pm S_{\pm x}+S_{xstepx} \pm S_{ystepx}$$

$$DY=K_2+K_4Y+K_6X+K_{12}X^2 \pm S_{\pm y}+S_{xstepy} \pm S_{ystepy}$$

and, determining the correction terms $K_3$, $K_5$, $K_6$, $K_{11}$, $K_{12}$ and $S_{\pm x}$, $S_{\pm y}$, $S_{\pm xstepx}$, $S_{\pm ystepy}$, $S_{\pm ystepx}$, $S_{\pm xstepy}$ by least-squares approximating.

13. The exposing method according to claim 10, wherein the predetermined coordinate systems is a system of rectangular coordinates taking the scanning direction along the y-axis and the direction orthogonal to the scanning direction along the x-axis; and the error parameter is calculated by preparing a reticle having a matrix of four or more marks in the scanning direction and four or more in the direction orthogonal to the scanning direction;

transferring the marks formed on the reticle into each shot area of a first pilot wafer, by using a first exposure unit which is used for exposing the overlaid layer;

detecting the position coordinates of the marks transferred to each shot area of the first pilot wafer in the coordinate systems;

transferring the marks formed on the reticle to each shot area of a second pilot wafer, by using a second exposure unit which is used for exposing the overlaying layer;

detecting the position coordinates of the marks transferred to each shot area of the second pilot wafer in the coordinate systems;

referring to the position coordinates of the marks transferred by using the first and second exposure units;

calculating the difference (dx, dy) between the respective coordinate elements of the two referenced position information;

substituting the difference (dx, dy) between the coordinates elements, and the position coordinates (x, y) formed without shifting the marks, into the equations $$dx=K_1+K_3x+K_5y+K_{13}x^3$$

$$dy=K_2+K_4y+K_6x+K_{10}xy$$

and, determining the correction terms $K_1$ and $K_2$ by least-squares approximating; and substituting the difference (DX, DY) between the barycentric coordinates and the position coordinates (X, Y) formed without shifting the marks, and the correction terms $K_1$ and $K_2$, into the equations $$DX=K_1+K_3X+K_5Y+K_{11}Y^2 \pm S_{\pm x} \pm S_{xstepx} \pm S_{ystepx}$$

$$DY=K_2+K_4Y+K_6X+K_{12}X^2 \pm S_{\pm y} \pm S_{xstepy} \pm S_{ystepy}$$

and, determining the correction terms $K_3$, $K_5$, $K_6$, $K_{11}$, $K_{12}$ and $S_{\pm x}$, $S_{\pm y}$, $S_{\pm xstepx}$, $S_{\pm ystepy}$, $S_{\pm ystepx}$, and $S_{\pm xstepy}$ by least-squares approximating.

14. The exposing method according to claim 10, wherein the correction parameter is used for correction of the error which occurs when moving the wafer stage in the stepping direction.

* * * * *

UNITED STATES PATENT AND TRADEMARK OFFICE
CERTIFICATE OF CORRECTION

PATENT NO. : 6,842,230 B2
DATED : January 11, 2005
INVENTOR(S) : Takakuwa et al.

It is certified that error appears in the above-identified patent and that said Letters Patent is hereby corrected as shown below:

Column 16,
Line 46, change "$S\pm_{ystepy}$," to -- $S_{\pm ystepy}$, --.

Column 17,
Line 24, change "$DX=K_1+K_3X+K_5Y+K_{11}Y^2\pm S_{\pm x}+S_{xstepx}\pm S_{ystepx}$" to
-- $DX=K_1+K_3X+K_5Y+K_{11}Y^2\pm S_{\pm x}\pm S_{xstepx}\pm S_{ystepx}$ --.
Line 26, change "$DY=K_2+K_4Y+K_6X+K_{12}X^2\pm S_{\pm y}+S_{xstepy}\pm S_{ystepy}$" to
-- $DY=K_2+K_4Y+K_6X+K_{12}X^2\pm S_{\pm y}\pm S_{xstepy}\pm S_{ystepy}$ --.

Signed and Sealed this

Seventeenth Day of May, 2005

JON W. DUDAS
*Director of the United States Patent and Trademark Office*